(12) United States Patent
Mathew et al.

(10) Patent No.: US 11,416,029 B2
(45) Date of Patent: Aug. 16, 2022

(54) ELECTRONIC DEVICES WITH THIN DISPLAY HOUSINGS

(71) Applicant: Apple Inc., Cupertino, CA (US)

(72) Inventors: Dinesh C. Mathew, San Francisco, CA (US); Adam T. Garelli, Morgan Hill, CA (US); Mikael M. Silvanto, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 135 days.

(21) Appl. No.: 16/558,756

(22) Filed: Sep. 3, 2019

(65) Prior Publication Data

US 2019/0391614 A1   Dec. 26, 2019

Related U.S. Application Data

(63) Continuation of application No. 15/191,416, filed on Jun. 23, 2016, now Pat. No. 10,429,892.
(Continued)

(51) Int. Cl.
*H01L 51/52* (2006.01)
*G06F 1/16* (2006.01)
*H01L 27/32* (2006.01)
*H05K 5/00* (2006.01)
*H05K 5/02* (2006.01)

(52) U.S. Cl.
CPC ........ *G06F 1/1637* (2013.01); *H01L 27/3244* (2013.01); *H01L 51/5237* (2013.01); *H01L 51/5246* (2013.01); *H01L 51/5281* (2013.01); *H05K 5/0017* (2013.01); *H05K 5/0226* (2013.01); *H01L 2251/301* (2013.01); *H01L 2251/5338* (2013.01)

(58) Field of Classification Search
None
See application file for complete search history.

(56) References Cited

U.S. PATENT DOCUMENTS 5,565,742 A   10/1996  Shichao et al.
5,879,568 A    3/1999  Urasaki et al.
(Continued)

FOREIGN PATENT DOCUMENTS

JP   2011085740   4/2011
JP      4973365   7/2012
WO   2014130982   8/2014

*Primary Examiner* — Xanthia C Cunningham
(74) *Attorney, Agent, or Firm* — Treyz Law Group, P.C.; G. Victor Treyz; David K. Cole

(57) ABSTRACT

An electronic device may have a housing formed from a rigid material such as metal or fiber-composite material. A display such as an organic light-emitting diode display may be attached to a planar wall portion of the housing using a layer of adhesive. A display cover layer may be attached to the organic light-emitting diode with a layer of adhesive. The adhesive layers may be rigid to enhance device stiffness. The housing may have curved sidewall portions that extend outwardly from the planar wall portion to enhance stiffness. The organic light-emitting diode display may have an array of pixels formed from thin-film transistor circuitry. The thin-film transistor circuitry may be formed on a substrate such as a glass substrate that is attached to the planar wall portion. The organic light-emitting diode display may have a circular polarizer that is attached to the thin-film transistor circuitry.

21 Claims, 9 Drawing Sheets

Related U.S. Application Data

(60) Provisional application No. 62/277,673, filed on Jan. 12, 2016.

(56) References Cited

U.S. PATENT DOCUMENTS

| | | | |
|---|---|---|---|
| 6,049,167 | A | 4/2000 | Onitsuka et al. |
| 6,791,660 | B1 | 9/2004 | Hayashi et al. |
| 9,141,224 | B1 | 9/2015 | Rowe et al. |
| 9,152,187 | B2 | 10/2015 | Yeh |
| 9,491,874 | B2 * | 11/2016 | Hirasawa .......... G02F 1/133528 |
| 10,222,837 | B1 * | 3/2019 | Budinich .............. G06F 1/1656 |
| 2003/0066672 | A1 | 4/2003 | Watchko et al. |
| 2004/0046184 | A1 | 3/2004 | Kanagawa et al. |
| 2004/0149987 | A1 | 8/2004 | Kim et al. |
| 2006/0044830 | A1 * | 3/2006 | Inoue ...................... G02B 5/08 362/614 |
| 2007/0247801 | A1 | 10/2007 | Bekele |
| 2008/0265255 | A1 | 10/2008 | Goyal |
| 2010/0225624 | A1 | 9/2010 | Fu et al. |
| 2010/0323165 | A1 | 12/2010 | Sakuma et al. |
| 2011/0019123 | A1 * | 1/2011 | Prest ...................... G02B 7/007 349/58 |
| 2011/0285607 | A1 * | 11/2011 | Kim .................... H04M 1/0216 345/1.3 |
| 2012/0118773 | A1 * | 5/2012 | Rayner ................ H05K 5/0004 206/320 |
| 2012/0214412 | A1 | 8/2012 | Schlub et al. |
| 2012/0281381 | A1 | 11/2012 | Sanford et al. |
| 2013/0034713 | A1 | 2/2013 | Busman et al. |
| 2013/0094126 | A1 | 4/2013 | Rappoport et al. |
| 2013/0135244 | A1 * | 5/2013 | Lynch ................... G06F 1/1652 345/174 |
| 2013/0164466 | A1 | 6/2013 | Khadilkar et al. |
| 2013/0188366 | A1 * | 7/2013 | Russell-Clarke .... H05K 5/0017 362/362 |
| 2013/0285539 | A1 * | 10/2013 | Kim .................... H01L 51/5281 313/504 |
| 2014/0009914 | A1 | 1/2014 | Cho et al. |
| 2014/0092356 | A1 | 4/2014 | Ahn et al. |
| 2014/0110036 | A1 * | 4/2014 | Mase .................... G06F 1/1601 156/60 |
| 2014/0123081 | A1 | 5/2014 | Park et al. |
| 2014/0126228 | A1 | 5/2014 | Lee et al. |
| 2014/0145150 | A1 | 5/2014 | de Jong et al. |
| 2014/0152890 | A1 * | 6/2014 | Rayner ................. H04N 5/2252 348/376 |
| 2014/0265821 | A1 * | 9/2014 | Malon ................... G06F 1/1626 313/504 |
| 2015/0070633 | A1 * | 3/2015 | Miyazaki .......... G02F 1/133528 349/96 |
| 2015/0125636 | A1 * | 5/2015 | Chan ..................... C25D 11/022 428/34.1 |
| 2015/0173233 | A1 | 6/2015 | Lu et al. |
| 2015/0222007 | A1 * | 8/2015 | Leonard ............... H01Q 1/2266 343/702 |
| 2015/0245513 | A1 * | 8/2015 | Moon ....................... G06F 1/16 361/679.01 |
| 2015/0260894 | A1 | 9/2015 | Nam et al. |
| 2015/0263309 | A1 | 9/2015 | Hong |
| 2016/0062001 | A1 * | 3/2016 | Wiersema ................ G02B 1/14 359/267 |
| 2016/0087022 | A1 | 3/2016 | Tsai et al. |
| 2016/0103259 | A1 | 4/2016 | Nam et al. |
| 2016/0231774 | A1 | 8/2016 | Lo et al. |
| 2017/0054105 | A1 | 2/2017 | Alonso et al. |
| 2017/0256737 | A1 | 9/2017 | Morishima et al. |
| 2017/0365500 | A1 | 12/2017 | Nakajima et al. |
| 2018/0143729 | A1 * | 5/2018 | Lee ........................ G06F 3/0416 |
| 2018/0159072 | A1 * | 6/2018 | Kim ..................... H01L 27/3246 |
| 2018/0181164 | A1 * | 6/2018 | Chen ..................... G06F 1/1652 |
| 2018/0226311 | A1 * | 8/2018 | Katayama ............... H01L 23/12 |

* cited by examiner

ELECTRONIC DEVICES WITH THIN DISPLAY HOUSINGS

This application is a continuation of U.S. patent application Ser. No. 15/191,416, filed on Jun. 23, 2016, which claims the benefit of provisional patent application No. 62/277,673, filed on Jan. 12, 2016, which are hereby incorporated by reference herein in their entireties.

FIELD

This relates generally to electronic devices and, more particularly, to electronic devices with displays.

BACKGROUND

Electronic devices often contain displays. For example, laptop computers contain displays.

Challenges can arise in mounting a display in an electronic device. If the portion of a device housing that receives the display is not sufficiently robust, the display may flex more than desired or may become damaged. At the same time, overly large display housings may be unwieldy and unattractive.

SUMMARY

An electronic device such as a laptop computer may have a housing. The housing may have portions that are coupled by hinges and that rotate relative to each other about a hinge axis. The housing may be formed from a rigid material such as metal or fiber-composite material.

A display such as an organic light-emitting diode display may be attached to a planar wall of the housing using a layer of adhesive. A display cover layer may be attached to the organic light-emitting diode with a layer of adhesive. The adhesive layers may be rigid to enhance device stiffness. Room-temperature-cured adhesives such as two-part adhesives or other adhesive materials may be used in forming the adhesive layers. The adhesive may be optically transparent. For example, the adhesive may be an optically clear adhesive such as a liquid optically clear adhesive.

The housing may have curved or planar sidewall portions that extend orthogonally from the planar wall to cover edge surfaces of the display and enhance housing stiffness. The organic light-emitting diode display may have an array of pixels formed from thin-film transistor circuitry. The thin-film transistor circuitry may be formed on a substrate such as a rigid glass substrate that is attached to the planar wall. The organic light-emitting diode display may have a circular polarizer that is attached to the thin-film transistor circuitry.

DETAILED DESCRIPTION

Electronic devices may be provided with displays. A display for an electronic device may be mounted in a housing. The housing and display may be configured to minimize the thickness of the electronic device while preserving a desired amount of display stiffness.

Figure 1:
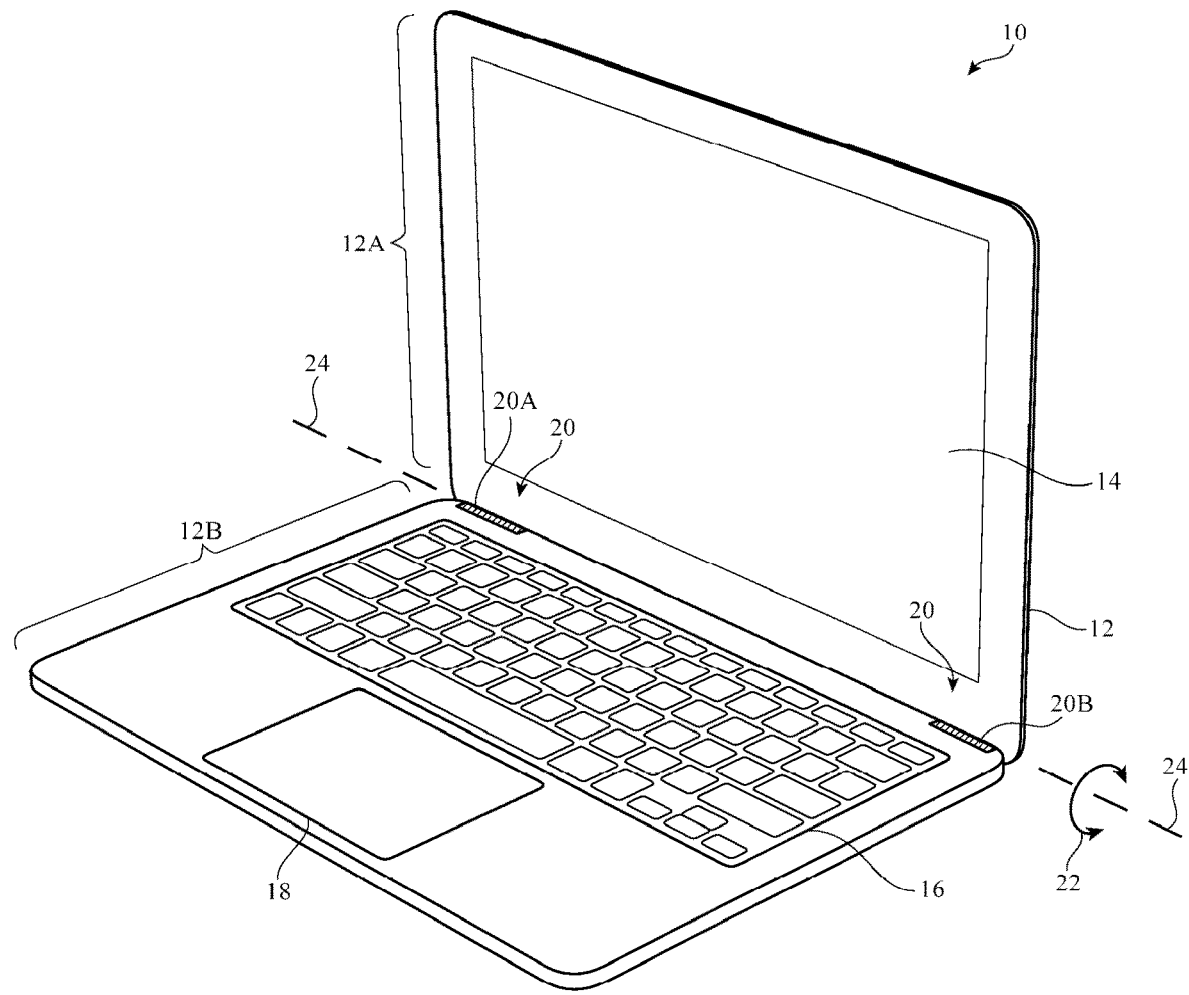
FIG. 1 is a perspective view of an illustrative electronic device in accordance with an embodiment.

FIG. 1 is a perspective view of an illustrative electronic device of the type that may include a display. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment.

In the illustrative configuration of FIG. 1, device 10 is a laptop computer. As shown in FIG. 1, device 10 may have a first housing portion such as upper housing portion 12A, which may sometimes be referred to as a display housing or display housing portion and a second housing portion such as lower housing portion 12B, which may sometimes be referred to as a base housing or base housing portion. Display 14 may be mounted in housing 12A. Components such as keyboard 16 and touchpad 18 may be mounted in housing 12B. Device 10 may have hinge structures 20 that allow upper housing 12A to rotate in directions 22 about rotational axis 24 relative to lower housing 12B. Hinge structures 20 may include two or more hinges such as hinge 20A at the lower left corner of display 14 and hinge 20B at the lower right corner of display 14 or may contain other structures that couple upper and lower housings 12A and 12B for rotational motion in directions 22 about axis 24. Upper housing 12A may be placed in an open or closed position by rotating upper housing 12A towards lower housing 12B about rotational axis 24.

Other configurations may be used for device 10 if desired. The example of FIG. 1 is merely illustrative.

In the example of FIG. 1, device 10 includes display 14. Display 14 has been mounted in housing 12 (i.e., in display housing 12A). Housing 12 (e.g., housing 12A and/or housing 12B), which may sometimes be referred to as an enclosure or case, may be formed of plastic, glass, ceramics, fiber composites (e.g., carbon fiber composites formed from carbon fibers in a polymer binder or other fiber composite materials), metal (e.g., stainless steel, aluminum, nickel-iron alloys such as Invar, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Openings may be formed in housing 12 to form communications ports, holes for buttons, and other structures.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch sensor electrodes may be formed from an array of indium tin oxide pads or other transparent conductive structures, metal lines, or other structures that do not block light being emitted by display 14.

Display 14 may include an array of pixels formed from liquid crystal display (LCD) components, an array of electrophoretic pixels, an array of plasma display pixels, an array of organic light-emitting diode pixels or other light-emitting diode pixels, an array of electrowetting pixels, or pixels based on other display technologies. To help reduce the thickness of device 10 (i.e., to reduce the thickness of the portion of device 10 formed from housing 12A), it may be desirable to form display 14 from display layers that are relatively thin. Illustrative configurations in which display 14 is formed from thin organic light-emitting diode display layers may therefore sometimes be described herein as an example.

Display 14 may be protected using a display cover layer such as a layer of transparent glass, clear plastic, transparent ceramic, sapphire or other transparent crystalline material, or other transparent layer(s). The display cover layer may have a planar shape, a convex curved profile, a concave curved profile, a shape with planar and curved portions, a layout that includes a planar main area surrounded on one or more edges with a portion that is bent out of the plane of the planar main portion, or other suitable shape. One or more openings may be formed in the display cover layer or the display cover layer may be free of openings.

Housing 12 (e.g., housing portions 12A and/or 12B) may have planar portions. For example, housing 12A may have a planar wall that supports the innermost surface of display 14. At the periphery of housing 12A, sidewall portions of housing 12A may extend out of the plane in which the planar wall portion of housing 12A lies. The sidewalls may extend out of the plane of the planar wall portion of housing 12A (e.g., orthogonally to the planar wall portion of housing 12A). Orthogonal sidewalls may have a curved shape that extends orthogonally from the main planar wall portion of housing 12A, may be planar sidewalls that extend vertically out of the plane of the planar wall (i.e., orthogonal sidewalls may be flat and have planar shapes that extend perpendicularly with respect to the main planar wall portion of housing 12A), or may have other suitable shapes. Illustrative configurations for housing 12 in which the edges of housing 12A have curved shapes (curved profiles) may sometimes be described herein as an example.

Figure 2:
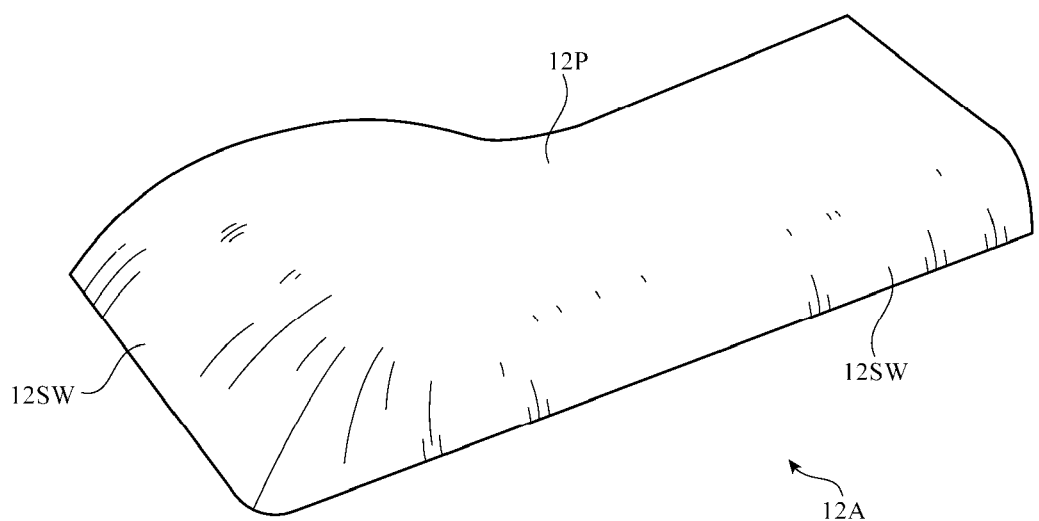
FIG. 2 is a rear perspective view of an illustrative display housing showing how the housing may have edges with curved profiles in accordance with an embodiment.

FIG. 2 is a rear perspective view of a portion of housing 12A showing how housing sidewall portions (i.e., walls such as sidewalls 12SW) may be formed from curved sidewall structures that extend from planar wall 12P and that run along the peripheral edges of planar wall 12P. In general, sidewalls 12SW may have a curved profile, a straight profile (e.g., a profile associated with a vertical planar shape), a profile with straight and curved portions, or other suitable shape. Arrangements for housing 12A that do not have sidewalls 12SW and that only have portions such as planar portion 12P may also be used in forming housing 12A.

Figure 3:
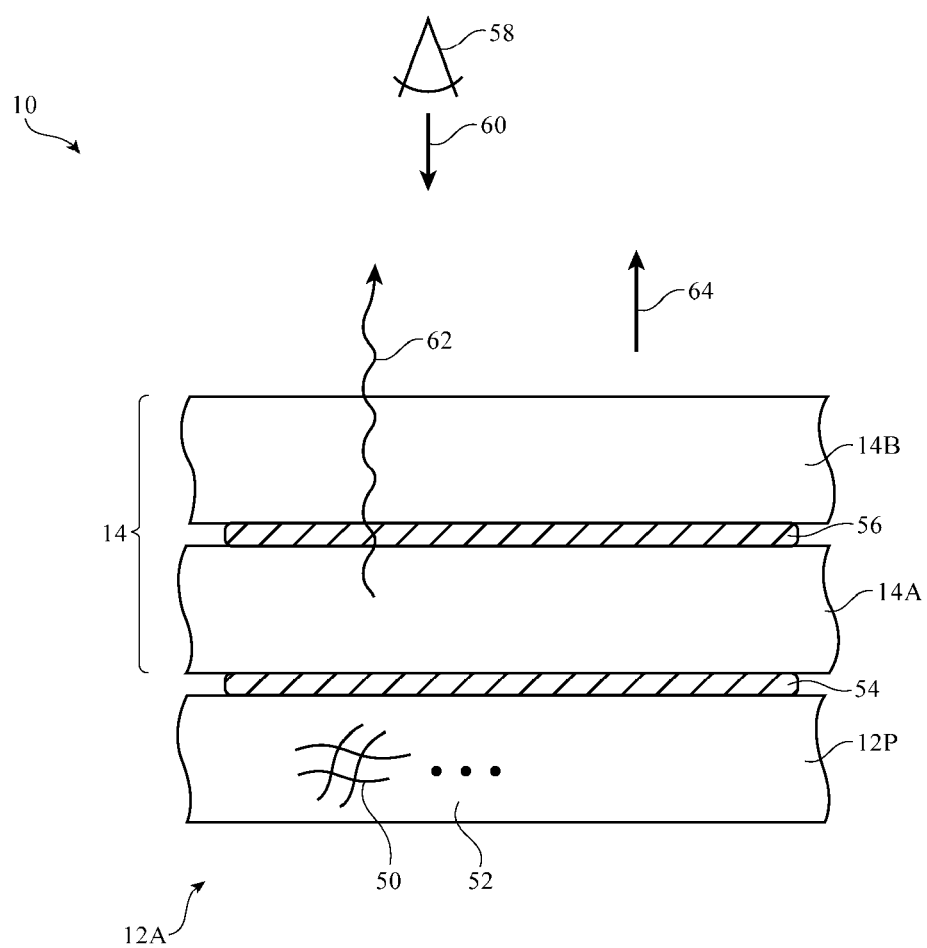
FIG. 3 is a cross-sectional side view of an illustrative electronic device display housing in accordance with an embodiment.

A cross-sectional side view of a portion of device 10 showing how display 14 may be mounted within housing 12A is shown in FIG. 3. As shown in FIG. 3, display 14 may be supported by planar housing wall 12P of housing 12A. Planar housing wall 12P may be formed metal, glass, ceramic, polymer, or other suitable materials. For example, housing wall 12P may be formed from a fiber-composite material having fibers 50 (e.g., carbon fibers, glass fibers, etc.) that are embedded within binder 52. Binder 52 may be formed from a polymer (e.g., a thermoplastic or thermoset polymer) or other suitable material. Fibers 50 may be randomly oriented or may form part of a fabric having a predetermined set of fiber orientations. As an example, fibers 50 may be formed from a woven fabric having perpendicular warp and weft fibers. Wall 12P may be formed by molding fiber-composite material or other material into a desired shape (e.g., using compression molding, injection molding, etc.) and/or by cutting, bending, stamping, machining, or otherwise patterning a solid piece of material into a desired housing shape.

One or more layers of adhesive may be used in coupling the structures of device 10 together within the portion of device 10 formed by upper housing 12A. As an example, one or more layers of adhesive may be used in coupling display 14 to housing 12A and/or in coupling together layers of material within display 14. In the illustrative configuration of device 10 of FIG. 3, the layers of material in display 14 are attached to housing wall 12P using adhesive layer 54. Adhesive layer 54 may be formed from any suitable adhesive. Rigid adhesives such as rigid epoxy or other rigid adhesive (e.g., adhesive with an elastic modulus of more than 3 GPa, more than 5 GPa, more than 10 GPa, or less than 50 GPa) may be used to help stiffen device 10. Adhesives that are less stiff may also be used (e.g., an adhesive with a modulus of elasticity of 1 MPa to 1 GPa, an adhesive with a modulus of elasticity of at least 200 MPa, an adhesive with a modulus of 0.5 GPa or more, an adhesive with a modulus of 1 GPa or more, etc.). Layer 54 may be a two-part epoxy that cures at room temperature and/or that cures at elevated temperatures, or may be other rigid adhesive. In situations in which it is possible to apply ultraviolet light or other light to the adhesive, a light cured adhesive material may be used. An advantage of using a two-part epoxy or other adhesive that cures at room temperature or close to room temperature is that this helps avoid stresses that might otherwise develop when heating materials in display 14 that have mismatched coefficients of thermal expansion. In general, any suitable adhesive may be used in forming adhesive layer 54.

Display 14 may be formed from one or more layers of material. In the example of FIG. 3, display 14 has one or more layers (sublayers) that form organic light-emitting diode display layer 14A (sometimes referred to as organic light-emitting diode display). A protective layer such as display cover layer 14B may be used to protect organic light-emitting diode display layer 14A. Layer 14B may be formed from a rigid material such as glass, transparent ceramic, sapphire or other crystalline transparent materials, stiff plastic, or other suitable transparent materials.

During operation of display 14, light 62 may be emitted in outward direction 64 by an array of pixels in display layer 14A to form images that are viewed by a user (e.g., a viewer such as viewer 58 who is viewing display 14 in direction 60). Display cover layer 14B may be attached to organic light-emitting diode display layer 14A by adhesive layer 56. Adhesive layer 54 may be formed from any suitable adhesive (e.g., a layer of rigid epoxy or other rigid adhesive having an elastic modulus of more than 3 GPa, more than 5 GPa, more than 10 GPa, or less than 50 GPa) or an adhesives that is less stiff (e.g., an adhesive with a modulus of elasticity of 1 MPa to 1 GPa, an adhesive with a modulus of elasticity of at least 200 MPa, an adhesive with a modulus of 0.5 GPa or more, an adhesive with a modulus of 1 GPa or more, etc.). To avoid obscuring images that are produced by the pixels of display layer 14A, adhesive 56 may be a layer of optically clear adhesive (e.g., liquid optically clear adhesive that is cured by application of heat, ultraviolet light, etc.).

Organic light-emitting diode display layer 14A may be a top emission or bottom emission display. In a top emission organic light-emitting diode display, light 62 is emitted outwardly from an array of thin-film organic light-emitting diode pixels without passing through an intervening substrate layer. In a bottom emission organic light-emitting diode display, light 62 is emitted through a transparent substrate (e.g., a clear polymer layer, a transparent glass layer, or other transparent substrate layer). In configurations in which display layer 14A is a bottom emission display, the transparent substrate of layer 14A may face outwardly and may serve to protect thin-film pixel circuitry for display 14. In this scenario, the use of protective outer structures such as display cover layer 14B and other protective outer layers can be minimized or eliminated (if desired). Display cover layer 14B may also be omitted in top emission displays (e.g., by providing the outer surface of a top emission display with a protective hard coat (e.g., one or more inorganic coating layers or other protective films).

To suppress ambient light reflections from reflective thin-film circuitry in an organic light-emitting diode display (e.g., reflections from metal lines, etc.), it may be desirable to cover the surface of the organic light-emitting diode display with a circular polarizer. A circular polarizer for display 14 may contain one or more layers of material (e.g., an iodine-doped stretched polyvinyl alcohol layer, supporting substrate layers such as triacetate cellulose layers, adhesive layers, etc.). The circular polarizer may be attached to the other layers of an organic light-emitting diode display using heat and pressure (e.g., by laminating the polarizer to underlying display layers using a layer of adhesive, etc.).

Figure 4:
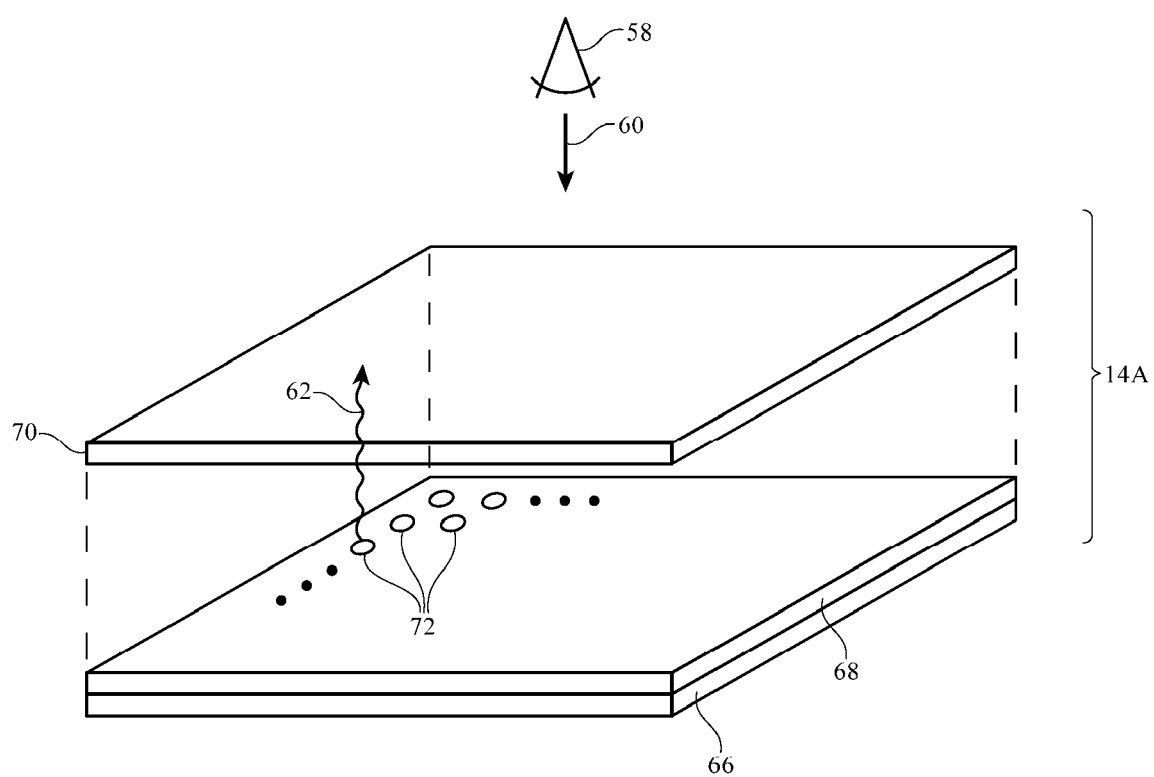
FIG. 4 is an exploded perspective view of an illustrative display in accordance with an embodiment.

An exploded perspective view of organic light-emitting diode display (display layer) 14A in a configuration in which display 14A has a circular polarizer layer is shown in FIG. 4. As shown in FIG. 4, display 14A may have a substrate layer such as substrate 66 (e.g., a layer of polyimide or other polymer, a layer of rigid material such as glass, or a layer of other material(s)). In configurations in which substrate 66 is formed from a rigid material such as glass (modulus 50-90 GPa), the overall stiffness of display 14 and housing 12A may be enhanced. A layer of thin-film transistor circuitry such as layer 68 may be formed on substrate 66. Circular polarizer layer 70 may be laminated to the upper surface of the layer of thin-film transistor structures (e.g., layer 70 may be attached to layer 68 using adhesive).

Layer 68 may include buffer layers and other thin-film dielectric layers, thin-film semiconductor layers, and thin-film metal layers and other conductive layers. Patterned organic emissive layer materials may be used in forming light-emitting portions of organic light-emitting diodes in layer 68. Moisture barrier layer structures may be formed on top of the thin-film circuitry. The thin-film structures of layer 68 may be patterned to form organic light-emitting diodes, transistors, capacitors, and other circuitry for display 14. For example, the thin-film circuits of layer 68 may be patterned to form pixel circuits for an array of pixels 72. Pixels 72 may each include a respective light-emitting diode and a circuit for controlling current flow through that light-emitting diode and thereby adjusting the amount of light 62 that is emitted by that diode and pixel.

Figure 5:
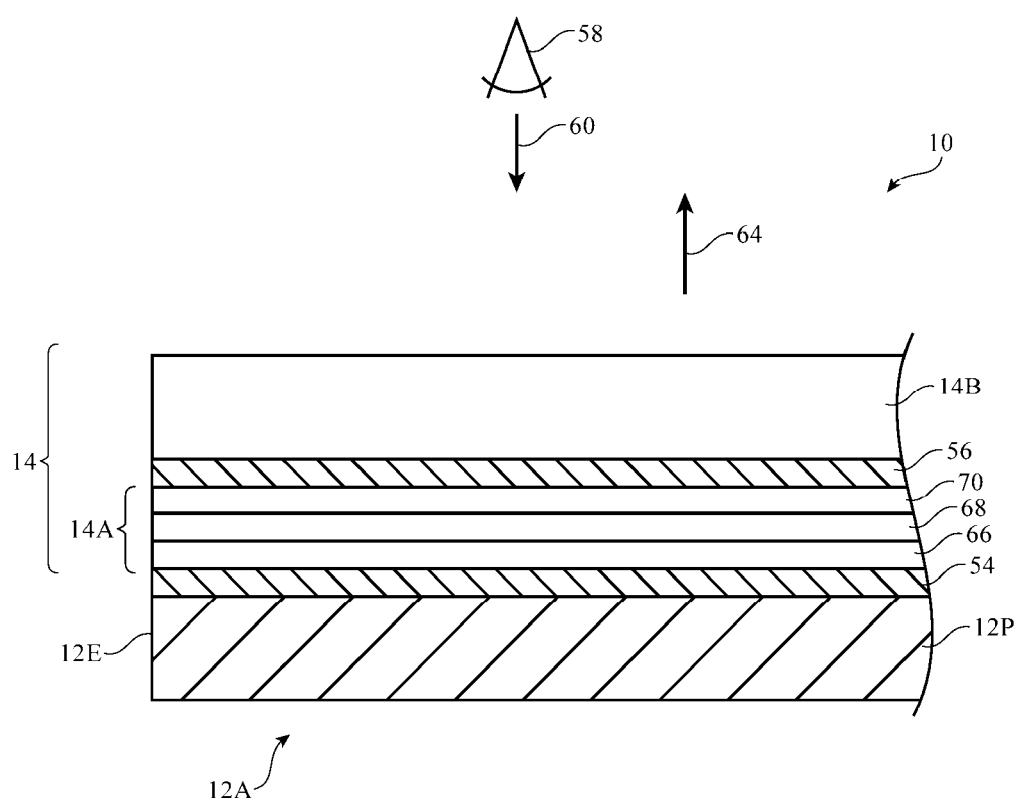
FIG. 5 is a cross-sectional side view of an illustrative electronic device having a display cover layer that protects underlying display layers in accordance with an embodiment.

A cross-sectional side view of an upper portion of device 10 in a configuration in which housing 12A does not have sidewall portions is shown in FIG. 5. As shown in FIG. 5, display 14 may be mounted in housing 12A using adhesive 54. Display 14 may be mounted so that the peripheral edge of display 14 is aligned with peripheral edge 12E of planar housing wall 12P of housing 12A. With this type of arrangement, housing 12A does not have any portions (or has only minimal portions) that cover the exposed edge surface of display 14. Display 14 may have a display cover layer such as layer 14B. Layer 14B may be attached to display layer 14A by adhesive 56 (as an example). Layer 14A may include substrate 66, thin-film transistor layer 68, and circular polarizer 70.

Figure 6:
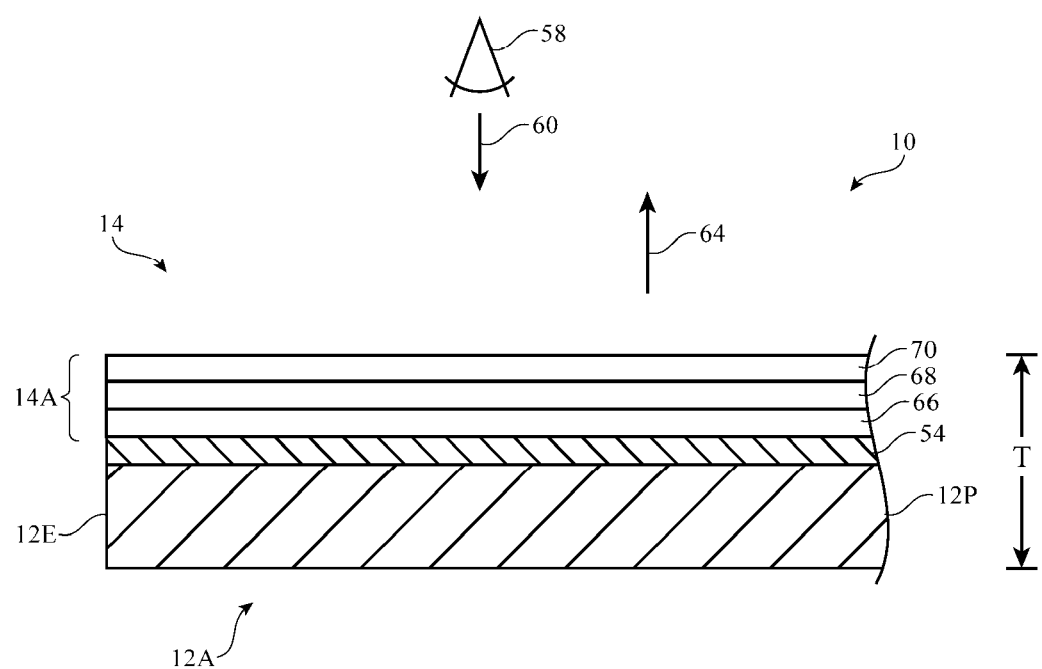
FIG. 6 is a cross-sectional side view of an illustrative electronic device of the type shown in FIG. 5 without a display cover layer in accordance with an embodiment.

In the illustrative configuration of FIG. 6, display 14 has a peripheral edge that is aligned with edge 12E of housing wall 12P of housing 12A, but does not have optional display cover layer 14B.

Figure 7:
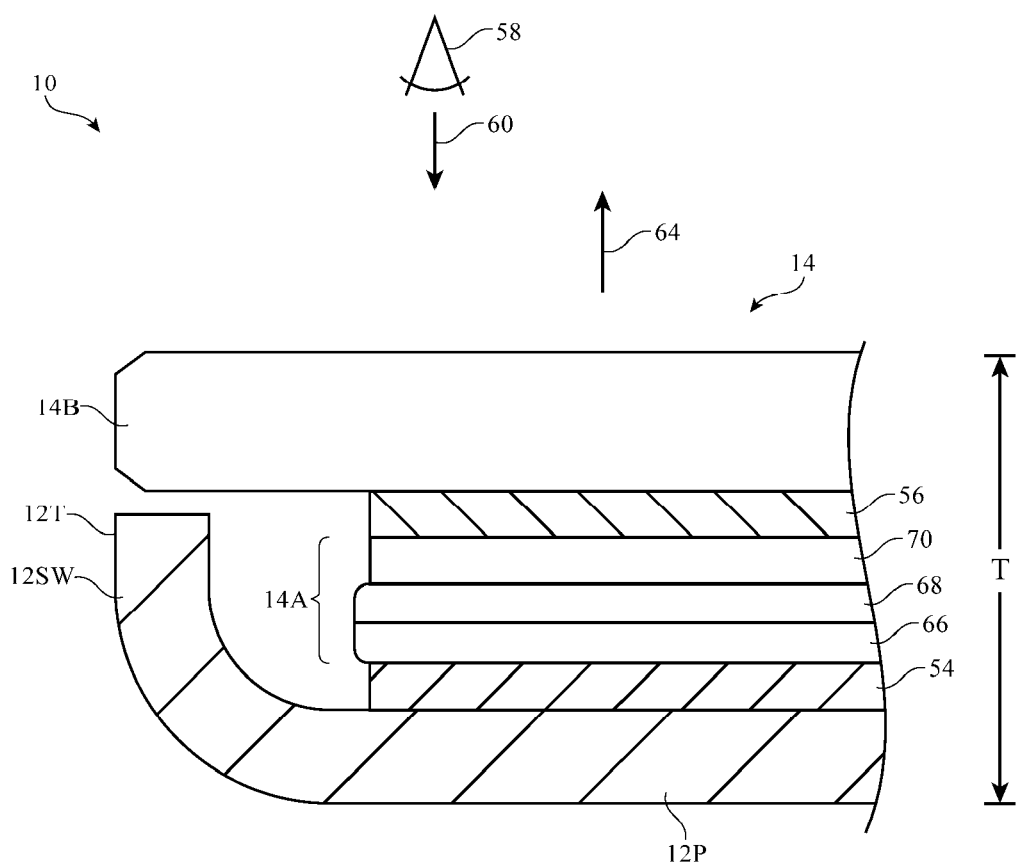
FIG. 7 is a cross-sectional side view of an illustrative electronic device having a display mounted in a housing with sidewall portions in accordance with an embodiment.

FIG. 7 is a cross-sectional side view of display 14 and housing 12A in a configuration for device 10 in which housing 12A has a curved portion (see, e.g., curved housing wall 12SW) or other sidewall portion that extends integrally outward from planar housing wall 12P (i.e., curved housing wall 12SW extends outwardly in direction 64 toward viewer 58 and curves away from the plane in which housing wall 12P lies). The edge surface of tip portion 12T of wall 12CW may be aligned with the peripheral edge surface of optional display cover layer 14B. Display cover layer 14B may be attached to display layer 14A using adhesive 56. Display layer 14A may include layers such as substrate layer 66, thin-film transistor layer 68 (e.g., a layer of circuitry on substrate 66 that forms an array of pixels 72), and polarizer 70. Display layer 14A may be coupled to rear housing wall 12P using adhesive 54.

As with the arrangement of FIG. 5, display cover layer 14B of display 14 of FIG. 7 need not be used in situations in which display 14A includes other forms of protection (e.g., a hard coat, a clear glass substrate in a bottom emission display or other substrate that can serve as a protective layer).

The total thickness T of the layers of display 14 may be 1 mm (e.g., when display cover layer 14B is omitted), may be 1.5 mm (e.g., when display cover layer 14B is attached to layer 14A using adhesive 56), may be 0.5-2 mm, may be more than 1 mm, may be more than 2 mm, may be 0.7 to 3 mm, may be more than 3 mm, may be less than 10 mm, may be less than 5 mm, may be less than 4 mm, may be less than 3 mm, may be less than 2.5 mm, may be less than 2 mm, or may have other suitable thickness. The individual layers of device 10 (e.g., housing 12P, display 14A, and optional display cover layer 14B) may have thicknesses of 0.1 mm to 1.5 mm, 0.3 mm to 0.7 mm, 0.2 mm to 1 mm, more than 0.3 mm, more than 0.5 mm, less than 0.3 mm, less than 0.5 mm, less than 0.7 mm, less than 1 mm, or other suitable thickness.

Adhesive layers 54 and 56 may have thicknesses of 0.01 to 0.1, less than 0.3, less than 0.075, more than 0.01, or other suitable thickness.

In general, stiffer configurations for the upper portion of device 10 are preferably to flexible configurations, because stiff configurations allow the thickness T of the upper portion of device 10 to be minimized. Arrangements that may be used to enhance stiffness include forming layer 12P from a stiff material such as metal (stainless steel, Invar, aluminum, fiber-composites such as carbon fiber composite material, etc.), forming cover layer 14B from a stiff material such as glass, and forming some or all of display 14A from stiff materials (e.g., forming substrate 66 from glass). Adhesive layers 54 and 56 may also be formed from stiff polymers and, if desired, a lip may be formed in housing 12A (see, e.g., curved housing wall portion 12CW of FIG. 7, which is an integral portion of planar wall 12P but which extends outwardly in direction 64 out of the plane of planar wall 12P). Any one or more, two or more, three or more, or four or more of these stiffness enhancing arrangements may be used to ensure that the upper portion of device 10 (housing 12A, display 14, etc.) has sufficient stiffness. This allows a user to open the upper portion of device 10 by pulling upward on housing 12A and/or display 14 to rotate housing 12A and display 14 about axis 24 without excessively bending housing 12A and display 14.

Figure 8:
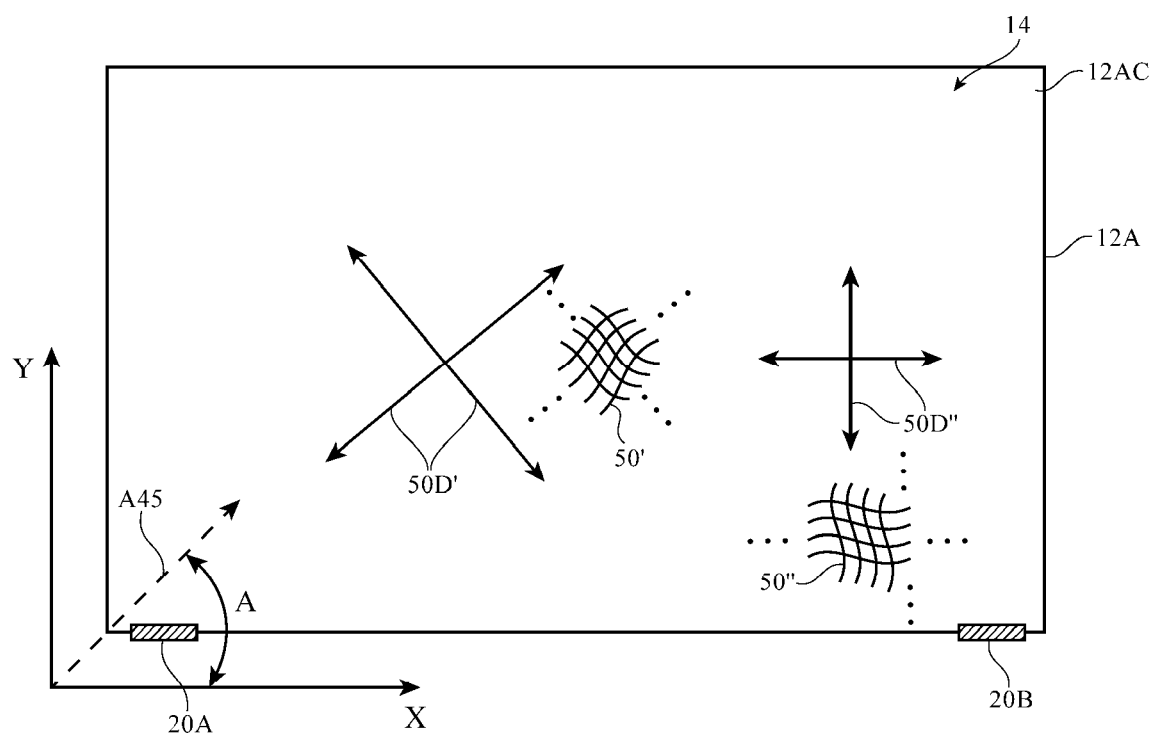
FIG. 8 is a diagram of an illustrative display housing showing how fiber composite material for forming the housing may have fibers that run parallel to the edges of the display housing or that run at non-zero angles with respect to the edges of the display housing in accordance with an embodiment.

In fiber composite configurations for display housing 12A, the orientation of fibers 50 may influence how easily housing 12A bends in certain usage scenarios. As shown in FIG. 8, housing 12A may have edges that run parallel to an X axis and a perpendicular Y axis. Carbon fibers or other fibers in a fiber-composite material for housing 12A can be oriented parallel to the X and Y axes, respectively (see, e.g., fibers 50" which are aligned with axes 50D") or can be oriented along direction A45 (and a direction that is perpendicular to A45). Direction A45 may be oriented at an angle A of 45° with respect to the X and Y axes or may be oriented in another direction that lies between the X-axis direction and the Y-axis direction (see, e.g., fibers 50' which are aligned with axes 50D' which are oriented at non-zero angles with respect to the edges of housing 12A). Fibers such as fibers 50' and fibers 50" may be provided in a woven fabric or other material that is embedded with polymer binder to form a fiber-based composite material for housing 12A. As shown in FIG. 8, the lower corners of housing 12A may be anchored to housing 12B using hinges 20A and 20B. In this scenario, orienting fibers 50' so that at least some of the fibers (e.g., a set of warp fibers or a set of weft fibers in a woven fabric of fibers 50) are oriented in a direction that extends diagonally across housing 12A (e.g., along direction A45) may help to stiffen housing 12A when a user pushes or pulls on a corner of housing 12A (see, e.g., corner 12AC).

Figure 9:
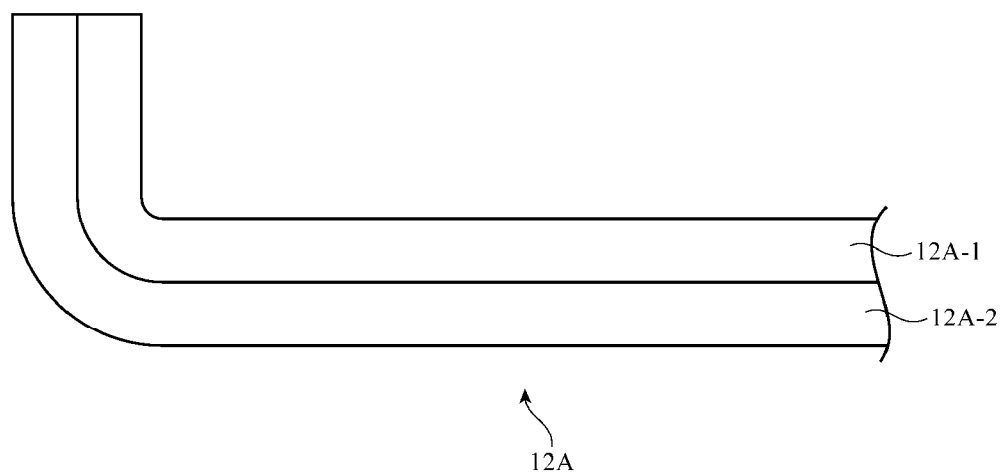
FIG. 9 is a cross-sectional side view of a portion of an illustrative display housing having multiple layers of material in accordance with an embodiment.

Housing 12 may be formed from more than one type of material. Housing 12 may, for example, include multiple layers of material that are attached to each other using adhesive, by forming one layer as a coating on another layer, by laminating layers together under heat and/or pressure, by attaching layers together using welds, fasteners or other attachment mechanisms, etc. A cross-sectional side view of housing 12A in an illustrative configuration in which housing 12A includes multiple layers such as inner layer 12A-1 and outer layer 12A-2 is shown in FIG. 9. If desired, housing 12A may have three or more layers. The arrangement of FIG. 9 in which housing 12A has a pair of layers is merely illustrative.

The layers of housing 12A may include one or more plastic (polymer) layers, metal layers, layers of glass, layers of ceramic, layers of carbon-fiber composite material, fiberglass, and/or other fiber composites, and/or other suitable layers of material. As an example, the innermost layer of housing 12A (e.g., layer 12A-1 in the example of FIG. 9) may be formed from a material such as aluminum or fiber composite material (e.g., carbon fiber, fiberglass, etc.). The outermost layer of housing 12A (e.g., layer 12A-2 in the example of FIG. 9) may be formed from a stiff layer such as a layer of steel. In configurations such as these, the inner layer would be formed from a material that provides structural support while helping to save weight. The steel layer in these configurations would serve as an outer cladding layer for the inner layer (e.g., the steel layer would form a cladding for an inner aluminum or fiber composite layer). A steel outer layer or a cladding layer of other materials may be used help enhance housing stiffness and/or to enhance device aesthetics.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a housing having a planar housing wall portion;
   a display cover layer; and
   an organic light-emitting diode display in the housing, the organic light-emitting diode display comprising:
      a polarizer layer attached to the display cover layer with a first layer of adhesive, and
      thin-film circuitry on a substrate, wherein the substrate is directly attached to the planar housing wall portion with a second layer of adhesive.

2. The electronic device defined in claim 1 wherein the first and second layers of adhesive each have a modulus of elasticity of at least 200 MPa.

3. The electronic device defined in claim 2 wherein the display cover layer is formed from a material selected from the group consisting of: glass, plastic, ceramic, and sapphire.

4. The electronic device defined in claim 3 wherein the substrate is a polymer substrate and wherein the thin-film circuitry forms an array of pixels on the polymer substrate.

5. The electronic device defined in claim 4 wherein the polarizer layer comprises a circular polarizer that is laminated to the thin-film circuitry.

6. The electronic device defined in claim 1 wherein the housing comprises glass material.

7. The electronic device defined in claim 6 wherein the substrate is formed from glass having a modulus of elasticity between 50 GPa and 90 GPa.

8. The electronic device defined in claim 1 wherein a combined thickness of the planar housing wall portion, the display cover layer, and the organic light-emitting diode display is less than 2 mm.

9. The electronic device defined in claim 1 wherein the housing comprises carbon fiber composite material.

10. The electronic device defined in claim 9 wherein the carbon fiber composite material comprises carbon fibers that are in a woven fabric and wherein the carbon-fiber composite material includes a polymer binder in which the woven fabric is embedded.

11. The electronic device defined in claim 1 wherein the housing has an inner layer and an outer layer.

12. The electronic device defined in claim 11 wherein the inner layer comprises a layer of metal that is selected from the group comprising: a layer of aluminum and a layer of copper.

13. The electronic device defined in claim 12 wherein the outer layer is a steel cladding layer.

14. The electronic device defined in claim 11 wherein the inner layer comprises fiber composite material.

15. An electronic device, comprising:
   a housing having a planar housing wall portion and a housing wall that extends from the planar housing wall portion;
   a display cover layer that overlaps at least a portion of the housing wall; and
   a display having a first display layer attached to the display cover layer with a first layer of adhesive and a second display layer attached to the planar housing wall portion with a second layer of adhesive, wherein the second display layer has a surface and wherein the second layer of adhesive is in contact with the surface.

16. The electronic device defined in claim 15 wherein the display is an organic light-emitting diode display comprising a thin-film transistor layer interposed between the first display layer and the second display layer.

17. The electronic device defined in claim 16 wherein the first display layer comprises a polarizer and the second display layer comprises a substrate formed from a material selected from the group consisting of: a polymer material and a rigid material having a modulus of elasticity between 50 GPa and 90 GPa.

18. The electronic device defined in claim 15 wherein the housing comprises carbon fibers in a woven fabric and a polymer binder in which the woven fabric is embedded.

19. An electronic device having a front and a rear, comprising:
   a first housing and a second housing that rotate relative to each other between an open position and a closed position, wherein the first housing has a first side that faces the front in the open position and a second side that faces the rear in the open position, and the first housing has a housing wall, wherein the housing wall has opposing outer and inner surfaces, and wherein the outer surface forms the second side of the first housing;
   a display mounted in the first housing, wherein the display is directly attached to the inner surface of the housing wall with a first layer of adhesive; and
   a display cover layer that overlaps the display, wherein the display is directly attached to the display cover layer with a second layer of adhesive.

20. The electronic device defined in claim 19 wherein the display comprises thin-film circuitry on a substrate that is attached to the first housing with the first layer of adhesive and a polarizer that is attached to the display cover layer with the second layer of adhesive.

21. The electronic device defined in claim 20 wherein the first housing has a planar housing wall portion and a curved housing wall portion, and wherein the display is directly attached to the planar housing wall portion with the first layer of adhesive.

* * * * *